US006919672B2

(12) United States Patent
Madocks

(10) Patent No.: US 6,919,672 B2
(45) Date of Patent: Jul. 19, 2005

(54) CLOSED DRIFT ION SOURCE

(75) Inventor: John Madocks, Tucson, AZ (US)

(73) Assignee: Applied Process Technologies, Inc., Tucson, AZ (US)

( * ) Notice: Subject to any disclaimer, the term of this patent is extended or adjusted under 35 U.S.C. 154(b) by 210 days.

(21) Appl. No.: 10/411,024

(22) Filed: Apr. 10, 2003

(65) Prior Publication Data

US 2003/0230961 A1 Dec. 18, 2003

Related U.S. Application Data

(60) Provisional application No. 60/371,354, filed on Apr. 10, 2002.

(51) Int. Cl.[7] ............................ H05H 1/54; H05H 1/02; H01J 37/08; H01J 41/12; F03H 5/00

(52) U.S. Cl. .................... 313/359.1; 250/424; 250/425; 250/427; 250/423 F; 315/111.91; 315/111.81; 313/161.1; 313/162.1; 313/231.01; 313/231.31; 313/231.41; 118/723 MW; 118/723 ME

(58) Field of Search ................................ 250/424, 425, 250/427, 423 F; 315/111.91, 111.81; 313/359.1, 161.1, 162.1, 231.01, 231.31, 231.41; 118/723 MW, 723 ME

(56) References Cited

U.S. PATENT DOCUMENTS 4,277,304 A 7/1981 Horiike et al. .............. 156/643
5,763,989 A * 6/1998 Kaufman ................. 313/361.1
5,892,329 A 4/1999 Arkhipov et al. ........ 315/111.11
5,945,781 A 8/1999 Valentian ............... 315/111.81
6,215,124 B1 4/2001 King ...................... 250/423 R

OTHER PUBLICATIONS

Shabalin, et al., "Industrial Ion Sources and Their Application for DLC Coating", 1999, pp. 1–6; Keem, High Current Denisty Anode Layer Ion Source; 2001, pp. 1–6.

Advanced Energy Industries, Inc., "Round and Linear Ion Beam Sources", 2000; Kaufman, et al., "End–Hall Ion Source", Jul./Aug. 1987, pp. 2081–2084.

* cited by examiner

*Primary Examiner*—Nimeshkumar D. Patel
*Assistant Examiner*—Elizabeth Rielley
(74) *Attorney, Agent, or Firm*—Dale F. Regelman

(57) ABSTRACT

A closed drift ion source which includes a channel having an open end, a closed end, and an input port for an ionizable gas. A first magnetic pole is disposed on the open end of the channel and extends therefrom in a first direction. A second magnetic pole disposed on the open end of the channel and extends therefrom in a second direction, where the first direction is opposite to the second direction. The distal ends of the first magnetic pole and the second magnetic pole define a gap comprising the opening in the first end. An anode is disposed within the channel. A primary magnetic field line is disposed between the first magnetic pole and the second magnetic pole, where that primary magnetic field line has a mirror field greater than 2.

22 Claims, 13 Drawing Sheets

CLOSED DRIFT ION SOURCE

This application claims the benefit of Provisional application No. 60/371,354, filed Apr. 10, 2002.

FIELD OF THE INVENTION

This invention relates to ion beam sources and to closed drift type ion thrusters. More particularly, it includes embodiments that extend the life and efficiency of these devices.

BACKGROUND OF THE INVENTION

Closed drift ion sources have been known since Russian ion thrusters for satellite propulsion were reported in the 1960's. Such prior art devices all suffer from problems of sputter erosion of the closed drift side walls, loss of energetic electrons to the side walls, and poor beam collimation out of the source.

Side wall erosion has deleterious effects on ion source performance. For example, the source wall inserts, magnetic poles, or other plasma exposed surfaces must be routinely replaced. Where replacement is not possible in space thruster applications, wall erosion is eventually catastrophic. In these applications, thrusters are rated in thousands of hours of life with some 2,000–10,000 hours being the published life expectancies.

In addition, ion sputtering of the side walls contaminates industrial ion source processes with the sputtered atoms. In many applications, this removes the ion source as a potential process tool.

Sputtering of the side walls raises the source wall temperature. This can be a severe problem in space based applications where heat must be dissipated by radiation. The high temperatures experienced by the side walls requires special, expensive materials.

Ions striking the side walls do not exit the source, reducing the source efficiency. As those skilled in the art will appreciate, "efficiency" is the ion current relative to the power supply discharge current.

In closed drift ion sources operated in the diffuse mode, erosion is particularly problematic if not ruinous. In the diffuse mode, the source is operated at sufficiently high pressure and power to create a neutral, conductive plasma in the gap between the poles. Operating in this mode, the plasma density is dramatically increased, and the electric fields change significantly, increasing ion bombardment of the pole pieces or side walls.

Moreover, still other problems are generally recognized with prior art closed drift ion sources. Loss of high energy electrons to the side walls affects acceleration channel type ion sources. Side wall losses of electrons capable of ionizing the propellant gas results in loss of efficiency and side wall heating. In addition, beam spreading outside the source results when the beam produced leaves the source in a spread cosine distribution rather than the preferred collimated output.

There are two basic types of closed drift ion sources for which many variations have been offered. The two types are anode layer and acceleration channel. Prior art examples for each type of source are described below.

FIG. 1 is a section view of prior art linear anode layer type ion source 100. Additional description of this prior art device can be found in Capps, Nathan, et al., Advanced Energy Industries, Inc. Application note: Ion Source Applications: Si Doped DLC, and in Advanced Energy Industries, Inc. Application note: Industrial ion sources and their application for DLC coating, which are hereby incorporated by reference.

Such a prior art source 100 can either be annular or stretched out to lengths beyond three meters, the confined Hall current design enables extendibility similar to a planar magnetron. FIG. 1 shows the magnetic field lines as calculated and mapped by a two-dimensional magnetic field software program. The field in the gap 120 is created by back shunt 110, permanent magnet 130, and pole pieces 140 and 150. Similarly, the field in gap 125 is created by shunt 110, permanent magnet 130, and pole pieces 150 and 160. Electrically, poles 140, 150, 160, and shunt 110 are connected to ground, and anodes 102 and 104 are connected to the positive terminal of a high voltage power supply.

As those skilled in the art will appreciate, the anodes in a closed drift ion source, such as anodes 102 and 104, are disposed a distance from the gap between the pole portions, such as gaps 120/125, respectively, where that distance exceeds the Larmor radius of the captured electrons. As those skilled in the art will further appreciate, the width of the gap, such as gap 120/125, is adjusted to maintain a magnetic field of sufficient strength to magnetize electrons and to allow a plasma to exist therein.

Referring to now FIGS. 1 and 1A, in prior art device 100, the half bevel shaped poles produce a magnetic fields with the strongest magnetic field line, described herein as the "primary field line," emanating from the flat, gap facing pole surfaces 142 (FIG. 1)/152 (FIG. 1) and 154 (FIG. 1A)/162 (FIG. 1A). The magnetic configuration and pole shapes of this prior art device, calculated using a Ceramic 8 ferrite type magnet 2, results in a primary field line 170 having a magnetic field strength of 682 Gauss at first end 172 on surface 154, 542 Gauss at second end 176 on surface 162 of outer pole 160, and a minimum strength of 445 Gauss at location 174. Because device 100 is symmetrical, the field strength in gap 120 are similar to those in gap 125. As those skilled in the art will appreciate, use of other magnetic materials will change the relative strengths of the field lines but will not substantially change the relative location of the primary line or ratio between surface and gap fields.

By "primary field line," Applicant means the field line having the least curvature and the strongest field strength in the gap. As the bloom of the field in the gap is viewed, the primary field line is the centerline of the bloom. Field lines to both sides of the primary field line are concave, i.e. curved, and face this field line.

As the magnetic field lines leave the high permeability pole 150 and 160, enter the "air" gap 120, and travel toward the center of the gap, the magnetic field strength lessens. Visually, this is seen as field lines spreading out in the gap. The result of this effect is a magnetic mirror. By "magnetic mirror," Applicant means the "reflection" of electrons as an electron moves from a region of weaker field to a stronger field.

Applicant has discovered that the mirror ratio is an important aspect of closed drift ion source magnetic field design. By "mirror ratio," Applicant means the ratio of the strong field strength at an end of the field line to the minimum field strength along that field line. For example, using calculated field strengths of the primary field line 170 at first end 176 and location 174, the magnetic mirror ratio for device 100 is calculated to be 1.22.

In addition, the ratio of the magnetic strengths at the end of the primary field line indicates whether that primary field line is substantially symmetric or asymmetric. By "substantially symmetric," Applicant means an end-to-end ratio of magnetic strengths of between about 0.94 to about 1.06. For prior art device 100, the ratio of the magnetic field strengths at locations 172 and 176 is about 1.26 indicating an asymmetric mirror field existing between the pole portions.

Applicant has found that a mirror ratio greater than 2 in combination with an end to end ratio of between 0.94 and 1.06 to be optimal. The magnetic pole design of device 100, however, produces weak magnetic mirror fields in gap 120/125. The result is that when a plasma is disposed in gap area 120 or 125, and when the source is operated and that plasma is ignited, electrons are not strongly focused into the center of the gap . This results in substantial sputtering of the poles, i.e. 140/150 for gap 120 and/or 150/160 for gap 125, and lower source efficiency.

Pole sputtering is exaggerated when the source is operated in the diffuse mode. This mode is entered when the plasma is dense enough to become electrically neutral. When this occurs, the electric fields change from a gradient field from the cathode poles to the anode 170/175 to a field dropping from the cathode poles across the dark space to the plasma and from the plasma to the anode. The diffuse mode is entered when a combination of higher process gas pressure and high discharge power produces a bright glow in the gap region. The diffuse mode is visually quite different from the collimated mode making the modes easy to distinguish by eye. In the diffuse mode, sputtering of the poles is increased due to the higher concentration of ions in the gap and the large voltage drop between the plasma and cathode pole surfaces.

Sputtering of the poles contaminates the substrate with sputtered material, causes wear of the cathode poles requiring their regular replacement, adds appreciably to the heat load the source must handle, and makes the source less energy efficient.

In contrast to this prior art device, Applicant's device creates a strong magnetic mirror field in the gap along the primary field line. Such a strong magnetic mirror has dramatic benefits for source operation. Without this focusing mirror field, not only are the poles eroded more rapidly, but the lack of the mirror field focusing effect causes the ion source to produce a broader, less collimated beam.

In addition, prior art device 100 includes a single central magnet. The resulting magnetic field is not symmetrical across gaps 120 and 125. As will be described below, by shaping the poles, strong mirror fields along the central field line can be created, and a symmetrical magnetic field helps to focus the plasma in the center of the gap and optimize magnetic mirror repulsion from the poles.

FIGS. 2 and 2A show a section view of prior art anode layer ion source 200. Device 200 includes shunt 210, pole portions 240, 250, 260, and anodes 202 and 204. The magnetic field in this prior art device shows no magnetic field emanating from the "points" 251 or 261 of the poles 250 and 260, respectively. An analysis of this pole design, shows that, again, the primary field line emanates from the flat faces 252 and 262 of poles 250 and 260, respectively, rather than from the pointed portions 251/261.

Magnetic field line 270 comprises the primary field line in this prior art embodiment. Field line 270 has a magnetic field strength of 683 Gauss at first end 272 on surface 252, 580 Gauss at location 276 on second end 262, and 373 Gauss at location 274 on field line 270. Point 274 comprises the portion of field line 270 having the minimum magnetic field strength. Dividing the magnetic field strength at end 272 by the magnetic field strength at location 274 gives a mirror ratio of 1.55. Dividing the strength at end 272 by the strength at end 276 gives a ratio of about 1.17 thereby indicating an asymmetric mirror field existing between the pole elements.

FIGS. 3 and 3A show prior art anode layer source 300. Device 300 includes permanent magnets 331, 332, and 333, in combination with pole portions 340, 350, 360, and anodes 302 and 304. Field line 370 comprises the primary field line produced by device 300. Field line 370 has a magnetic field strength of 1013 Gauss at first end 372 on surface 352, 954 Gauss at second end 376 on surface 362, and a minimum strength of 565 Gauss at location 374 on field line 370. Therefore, the mirror ratio for the primary field line for device 300 is 1.69.

The strongest fields emanate from locations 380 and 390, i.e. from the pole surfaces are at the corners of the bevels. As FIG. 3A shows, there exist no magnetic field lines interconnecting locations 380 and 390 that are parallel with primary field line 370.

FIG. 4A shows a second type of ion source sometimes referred to as an acceleration channel type. Acceleration channel type ion source 400 is typical of prior art ion thruster propulsion devices. U.S. Pat. No. 5,892,329, in the name of to Arkhipov et al., and U.S. Pat. No. 5,945,781, in the name of Valentian, describe such sources. Acceleration channel sources are commonly used in space thruster applications but can be adapted for industrial use also.

FIG. 4A shows the magnetic field lines produced by acceleration channel source 400. In this source, magnetic poles 440, 450 and 460 are electrically floating. An electron source 480 serves as the cathode with anodes 402 and 404 located inside ceramic isolators 490 and 495, respectively. Anode 470 is positioned at the bottom of channel 422 such that electrons must pass through magnetic fields crossing gap 420 to reach anode 402.

It is known that the ceramic side walls of an acceleration channel source, such as source 400 tends to be eroded by ion bombardment. Because prior art device 400 separates the magnetic poles 440 and 450 from the channel with the insulating ceramic 490, and because device 400 does not optimize the pole shapes, a strong magnetic focusing mirror radial field is not created in the channel.

Prior art device 400 produces a primary field line 470 having a magnetic field strength of 1011 Gauss at first end 472 on the inner surface of insulator 495, 883 Gauss at second end 476 on inner surface of insulator 495, and a minimum magnetic field strength of 687 Gauss at location 474. This being the case, the magnetic mirror ratio along the primary field line for device 400 is 1.29. Dividing the strength at location 472 by the strength at location 476 gives a ratio of about 1.15 thereby indicating an asymmetric mirror field existing between the pole elements.

Such a weak mirror field results in electrons being accelerated into the magnetic field by the electric field, and being trapped by the radial magnetic field. Without a containing radial magnetic mirror field, these energetic electrons move along the field lines and are absorbed by the side walls. These high energy electrons are capable of ionizing a neutral atom and are particularly expensive to lose. Not only is the source ionization efficiency lowered, but the side walls are additionally heated.

In addition, ambipolar diffusion causes the side walls to be charged negatively, and ions are attracted to the side walls. Moreover, the lack of radial electron focusing results in electron distribution across the full channel width. Ions then are created across the full width producing a wider, less collimated beam and added likelihood of hitting the side wall.

Only the ions created in the center of the channel experience the electric field pushing them perpendicularly out of the source. However as described above, without strong electron focusing, fewer are created in the center of the channel, such as channel 422/427.

FIG. 4B is a section view of ion source 900 described in U.S. Pat. No. 5,763,989 in the name of Kaufmann. Ion source 900 includes poles 940, 950, and 960, in combination with anodes 902/904, in further combination with a magnetic screen shunt similar to that taught in U.S. Pat. No. 5,892,329 in the name of Arkhipov, except the Kaufman shunt is arranged to allow a single permanent magnet to be used. This shunt technique produces a limited focusing effect in the acceleration channel that results in reduced wall losses and less wall erosion.

While producing a mirror field at one side of the gap, the flat pole faces produce a weak mirror field in the center of the gap. Device 900 produces a primary field line having a magnetic strength of 600 Gauss at first end 972, 550 Gauss at second end 976, and a minimum magnetic field strength of 400 Gauss at location 974. Therefore, the mirror ratio for device 900 along the central primary field line 970 is 1.4. Dividing the strength at end 972 by the strength at end 976 gives an end-to-end ratio of about 1.09 indicating an asymmetric mirror field.

U.S. Pat. No. 4,277,304 in the name of Horiike et al. teaches an ion source and ion etching process. Horiike et al. teach an arrangement for what is termed a grid-less ion source. The ion beam is created by two cathode surfaces with a magnetic field passing between the two surfaces The cathode surfaces and magnetic field are shaped into a racetrack to provide an endless Hall current confinement zone. An anode is disposed on one side of the racetrack magnetic field loop. This arrangement produces an ejection of ions from the side opposite the anode. Other prior art devices implemented electromagnets to create the magnetic field between the cathode surfaces. Horiike et al. teach use of permanent magnets.

U.S. Pat. No. 5,359,258 to Arkhipov et al. teaches a closed drift ion accelerator wherein side wall erosion is reportedly lessened by lowering the amount of magnetic field in the acceleration channel by shunting the field with permeable screens. The idea is to move the containment of electrons from the central channel area out closer to the opening. The screens also shape the M field to provide an amount of focusing of the plasma that helps to reduce side wall erosion. According to Arkhipov et al., the focusing effect allows making the channel walls thicker so the source lasts longer too.

Arkhipov et al. nowhere teaches shaping the magnetic poles to produce a strong radial mirror magnetic field in the gap and, more particularly, to produce that strong mirror field along the primary field line. As shown in FIG. 4A, when the poles are separated from the channel by an insulator, the mirror ratio along the primary field line is less than 2.

U.S. Patent No. 5,838,120 in the name of Semenkin et al. describes an anode layer source comprising a magnetically permeable anode to shape the magnetic field. The use of a magnetic shunt to remove radial, poorly mirrored magnetic field from the central channel, and moving the anode closer to the exit end, may reduce wall erosion. This prior art device, however, only provides marginal improvements. Semenkin et al. nowhere teaches shaping of the magnetic field to produce a strong, focusing mirror field along the primary field line. The device taught by Semenkin et al. results in electrons that are largely free to move along magnetic field lines and, in this case, recombine at the walls.

U.S. Pat. No. 6,215,124 in the name of King discloses a multistage ion accelerator with closed electron drift. In this device, the life and efficiency of the thruster is improved by shunting the magnetic field away from the central accelerator channel region and moving the $B_{max}$ field line toward the open end. When this is done, the region of wall erosion moves farther toward the opening, extending the life of the thruster. While use of thin pole pieces could generate a mirror field of some strength, the poles are distanced from the channel by inserts. The result is a weak magnetic mirror field at the exit end with the accompanying negative results.

SUMMARY OF THE INVENTION

Applicant's invention includes a closed drift ion source which includes a channel having an open end, a closed end, and an input port for an ionizable gas. A first magnetic pole is disposed adjacent the open end of the channel and extends therefrom in a first direction. A second magnetic pole disposed adjacent the open end of the channel and extends therefrom in a second direction, where the first direction is opposite to the second direction. The distal ends of the first magnetic pole and the second magnetic pole define a gap comprising the opening in the first end. An anode disposed within the channel. A primary magnetic field line is disposed between the first magnetic pole and the second magnetic pole, where that primary magnetic field line has a mirror field greater than 2.

Applicant's invention further includes a method to focus a plasma. Applicant's method provides an ionizable gas and introduces that ionizable gas into Applicant's closed drift ion source comprising a first magnetic pole and a second magnetic pole separated by a gap. Applicant's method produces a primary magnetic field line disposed between the first magnetic pole and the second magnetic pole, wherein that primary magnetic field line has a mirror field greater than 2. Applicant's method forms in the gap a plasma from the ionizable gas.

DETAILED DESCRIPTION OF THE PREFERRED EMBODIMENTS

While the prior art has recognized the problems of existing ion source technology, Applicant's improvements described herein address these prior art problems. Referring to the illustrations, like numerals correspond to like parts depicted in the figures. The invention will be described as embodied various ion source devices to contain, focus, and direct a plasma formed from one or more ionizable gases. The introduction of such one or more ionizable gases into an ion source device, and the formation and ignition of such a plasma is known to one of ordinary skill in the art. This being the case, for purposes of simplicity FIGS. 5, 6, 7, 8, and 9, do not show an input for one or more ionizable gases or a plasma formed therefrom.

Figure 1:
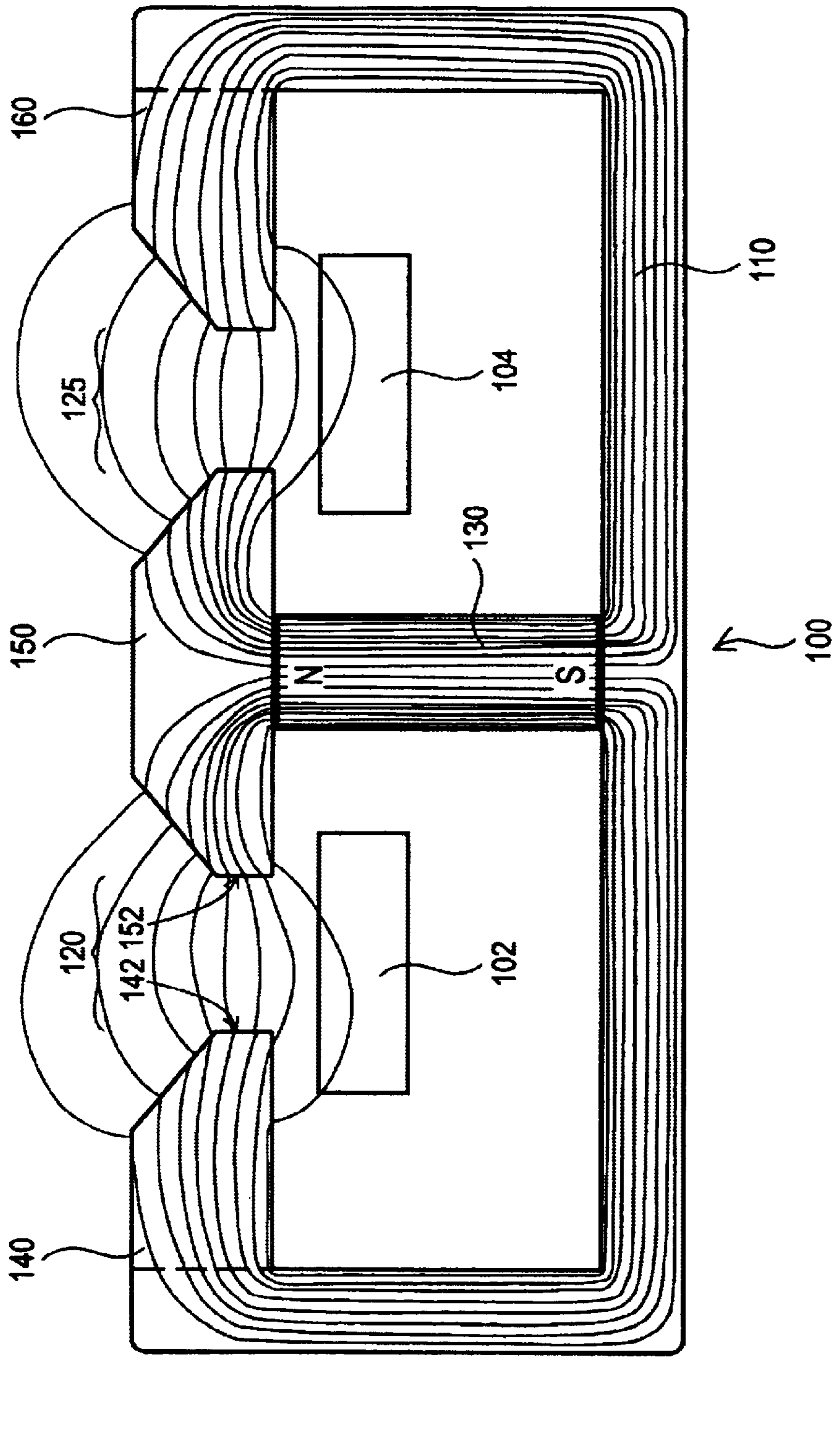
FIG. 1 PRIOR ART
FIG. 1 is a section view of one prior art closed drift ion source device.
Figure 1A:
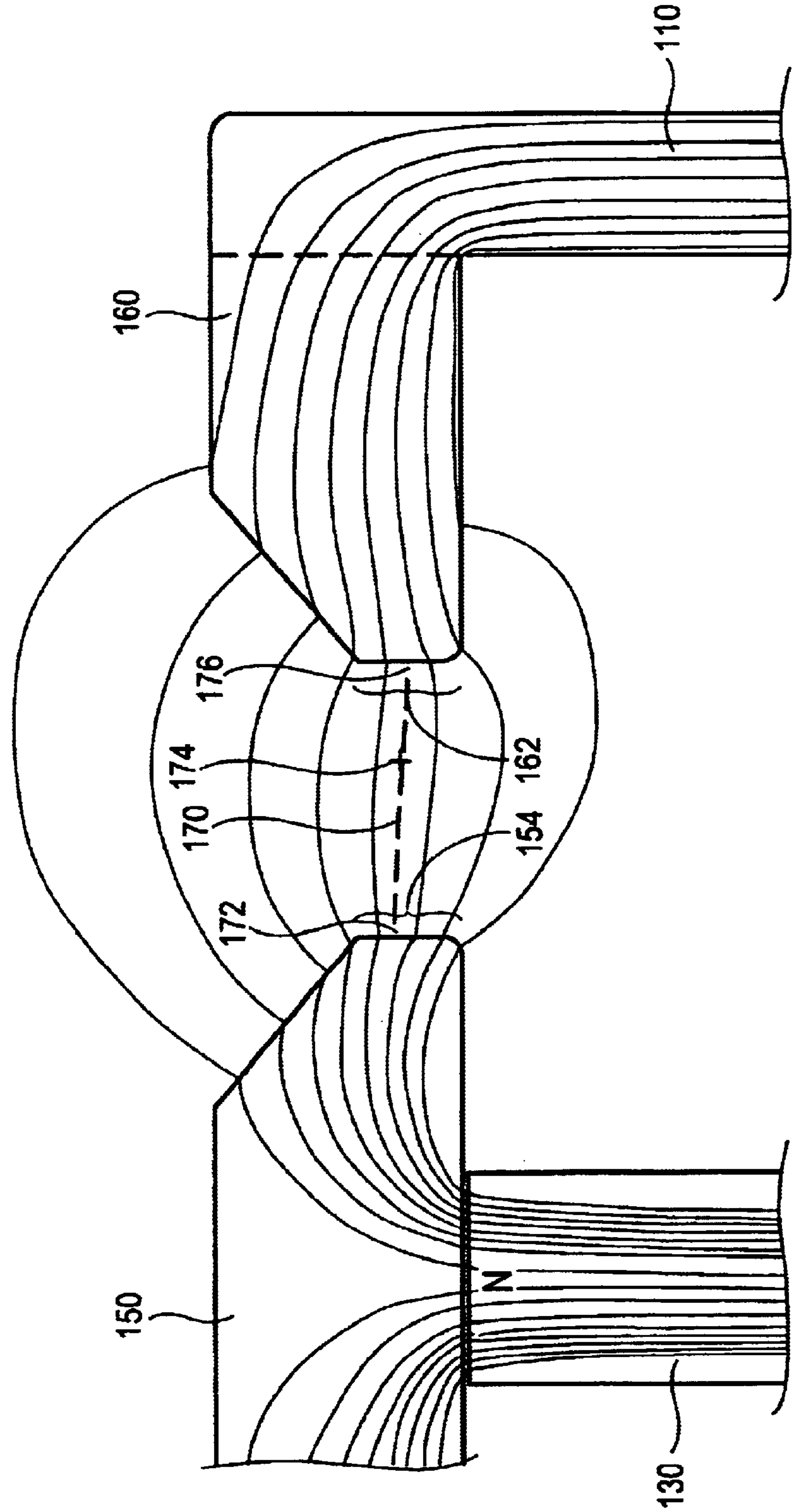
FIG. 1A PRIOR ART
FIG. 1A is a detail view of one gap region of the device of FIG. 1.
Figure 2:
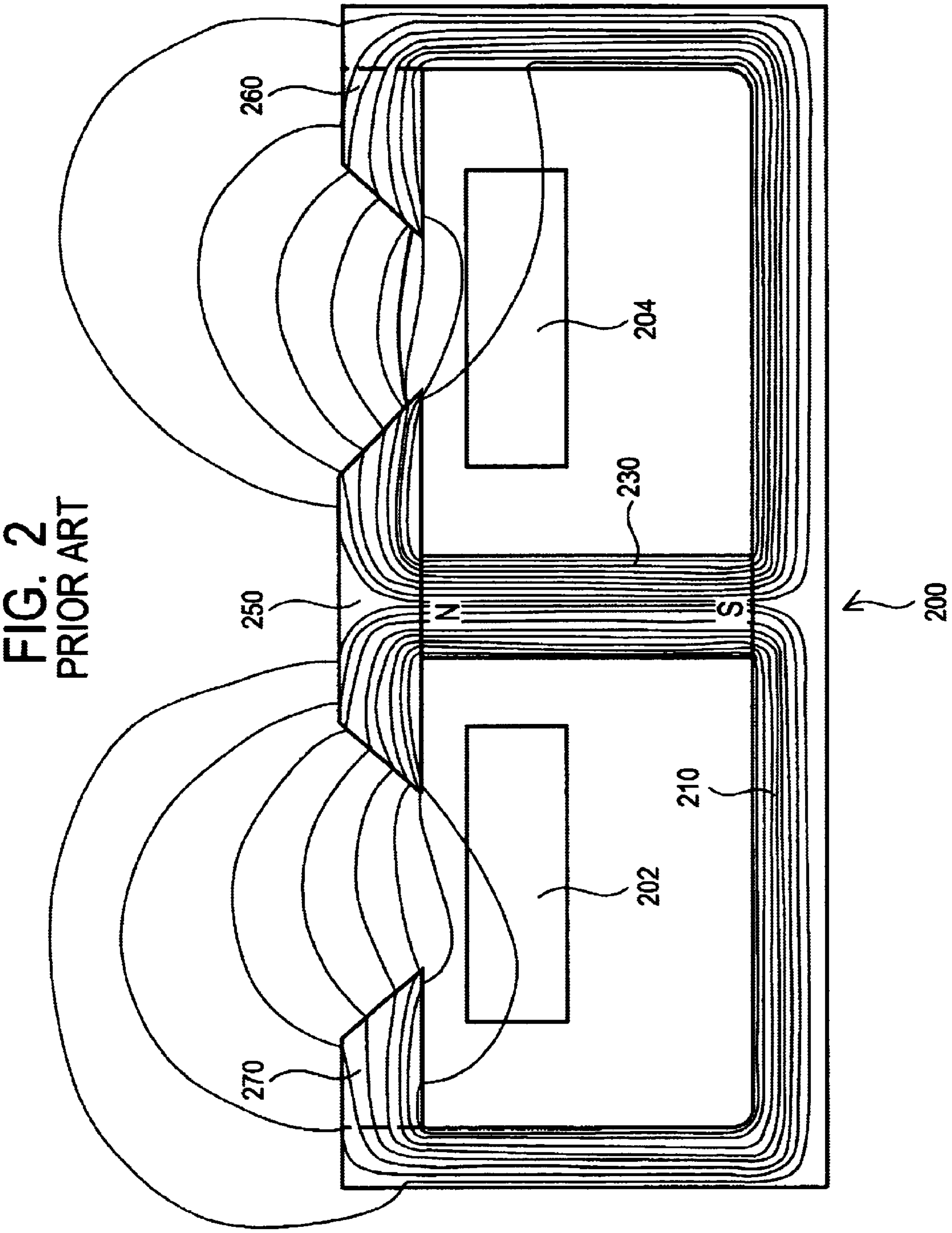
FIG. 2 PRIOR ART
FIG. 2 is a section view of a prior art acceleration channel ion source.
Figure 2A:
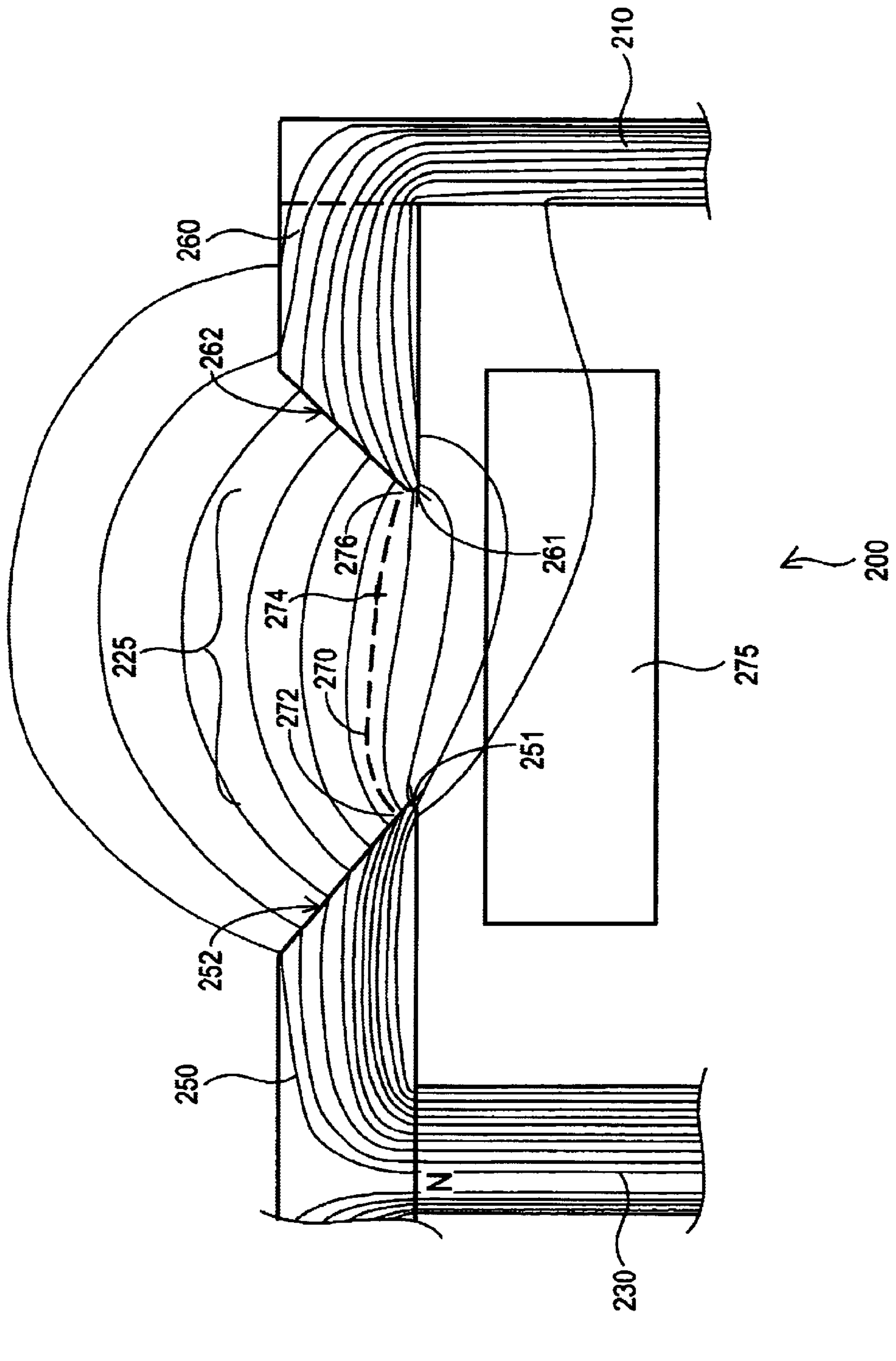
FIG. 2A PRIOR ART
FIG. 2A is a detail view of one gap region of the device of FIG. 2.
Figure 3:
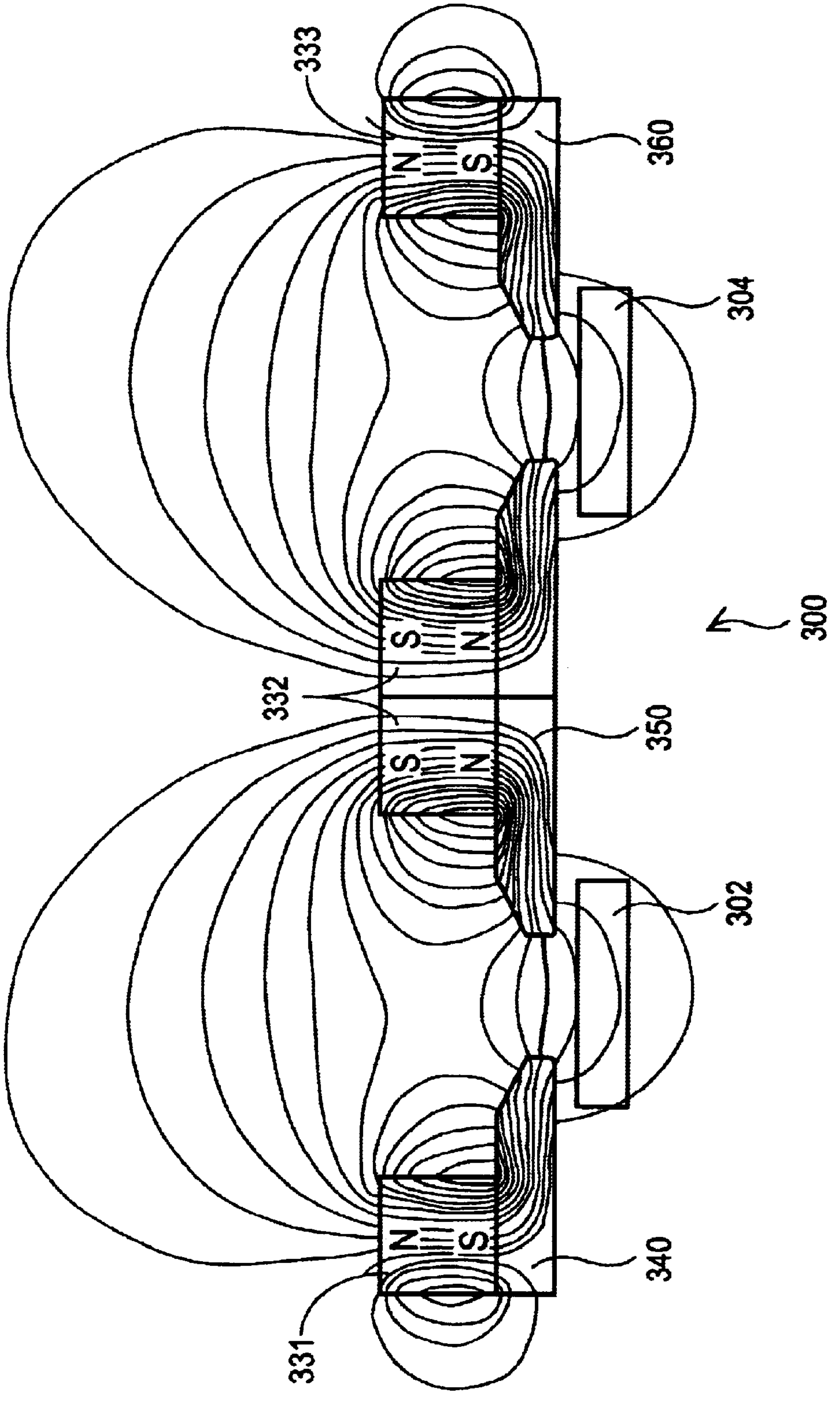
FIG. 3 PRIOR ART
FIG. 3 is a section view of yet another closed drift ion source.
Figure 3A:
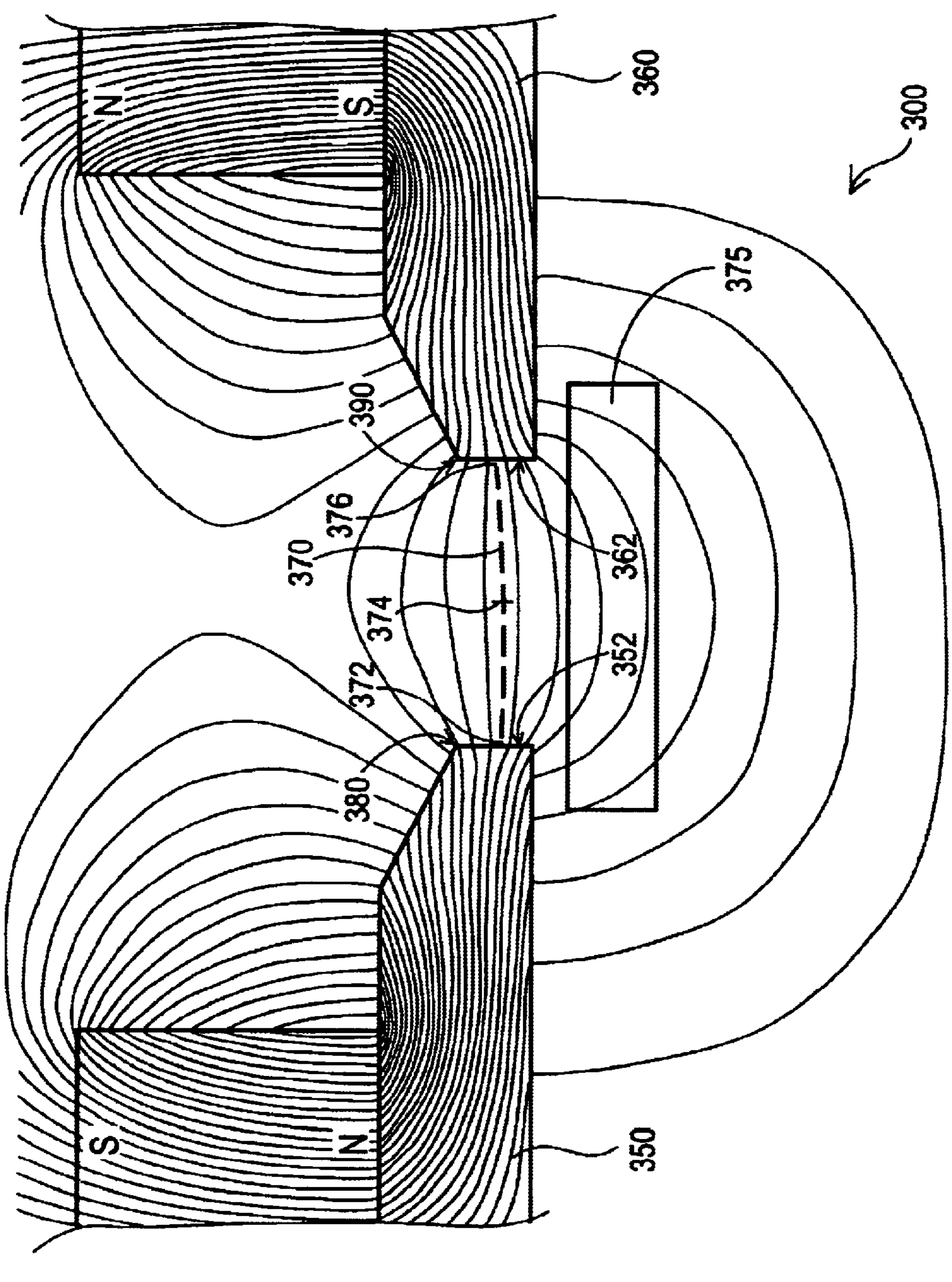
FIG. 3A PRIOR ART
FIG. 3A is a detail view of one gap region of the device of FIG. 3.
Figure 4A:
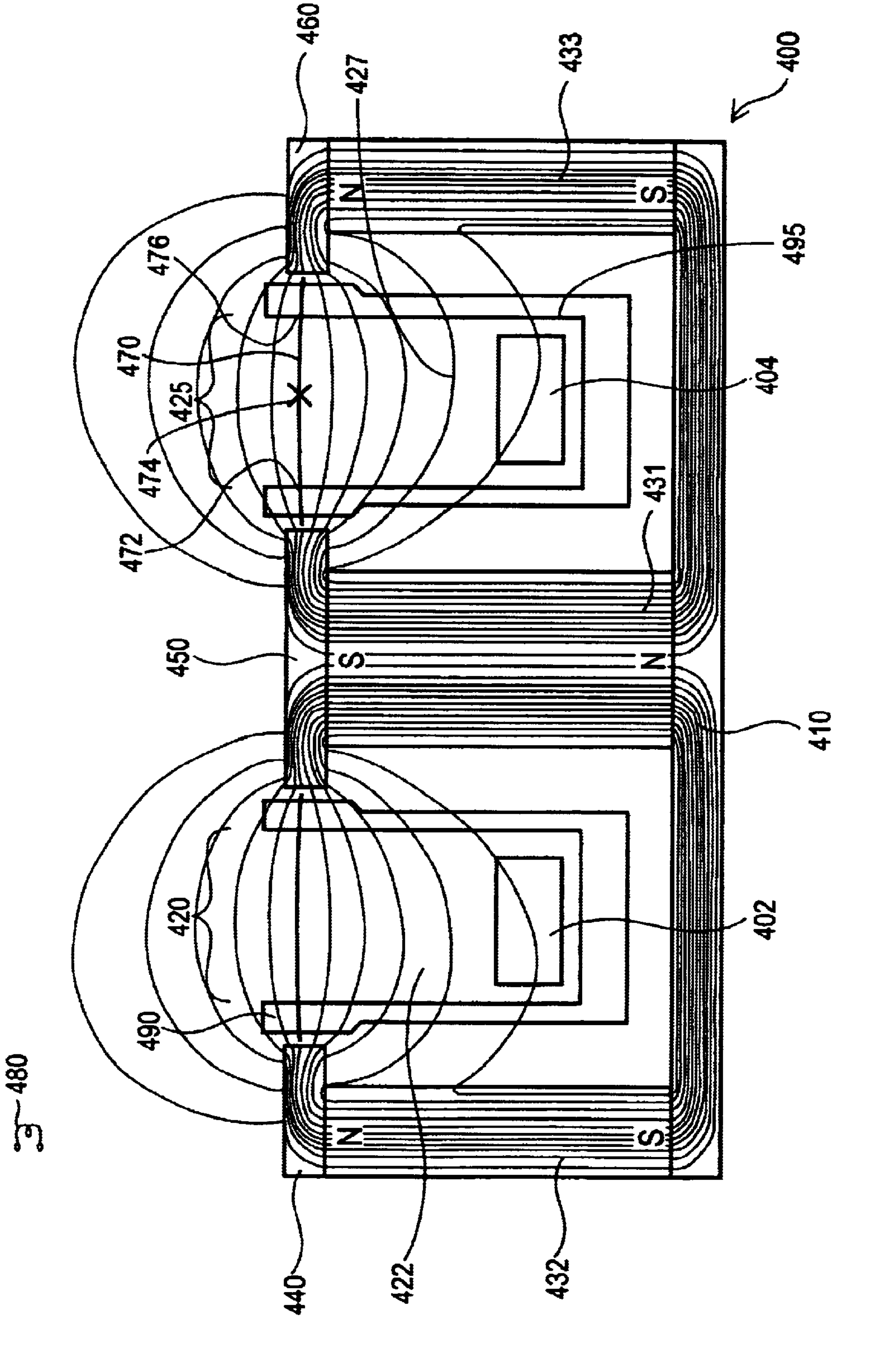
FIG. 4A PRIOR ART
FIG. 4A is a section view of a prior art closed drift ion source implementing a permeable shunt to shape the magnetic field.
Figure 4B:
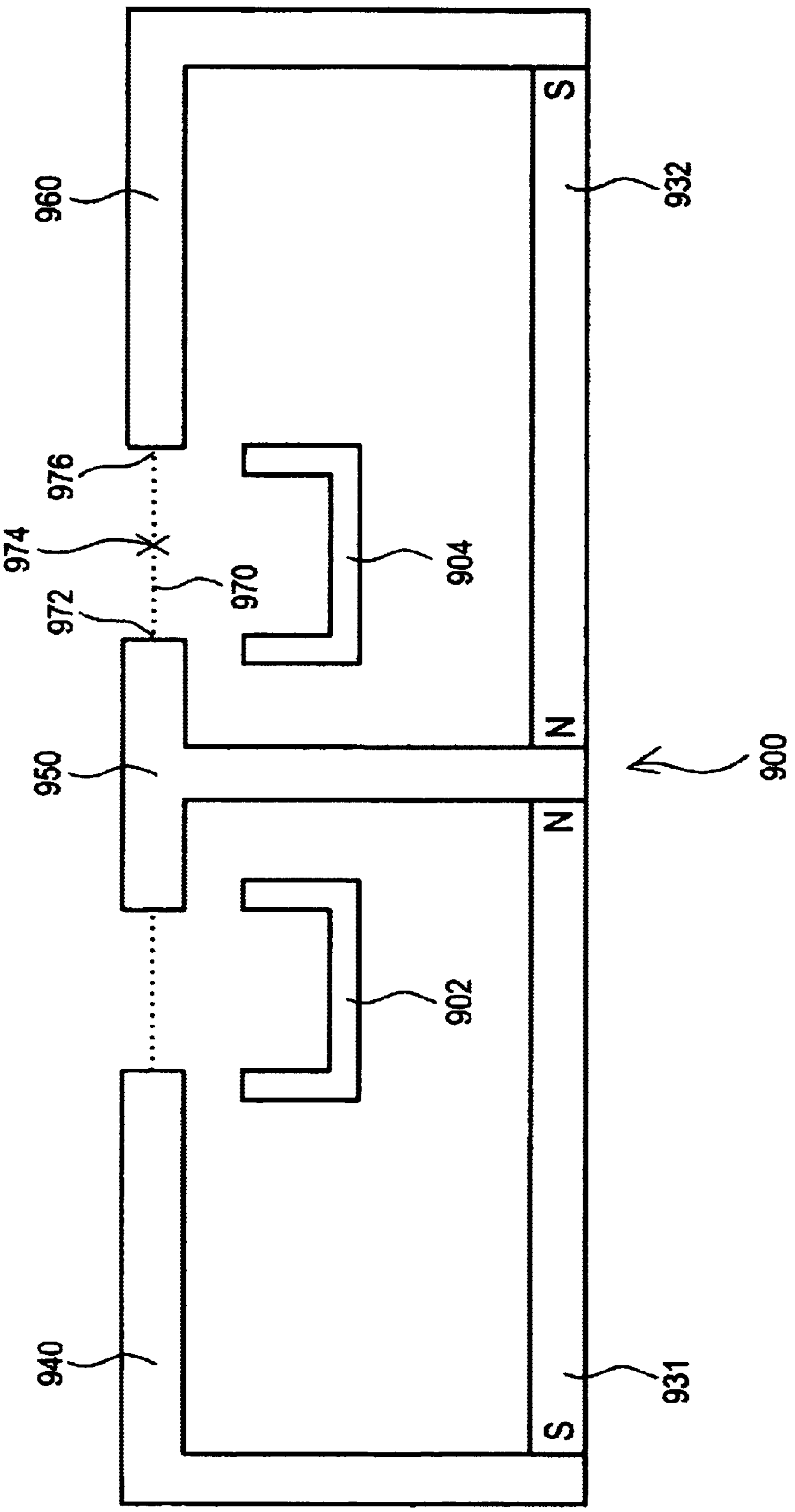
FIG. 4B is a section view of the source in U.S. Pat. No. 5,763,989.
Figure 5:
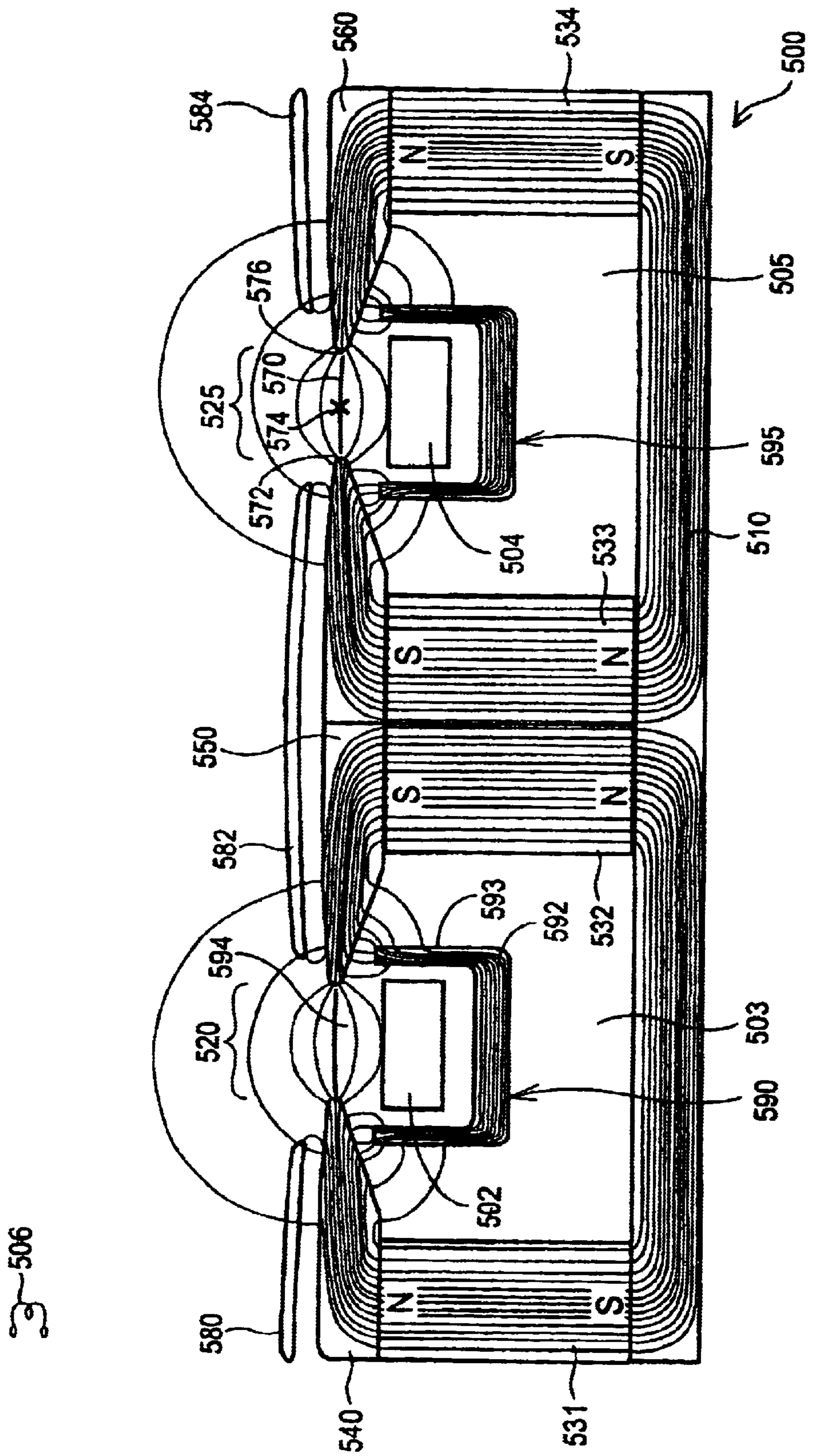
FIG. 5 is a section view of one embodiment of Applicant's ion source.

Referring now to FIG. 5, device 500 comprises one embodiment of Applicant's closed drift ion source. Device 500 includes a channel 503 having a closed end and an open end, where that channel is defined by magnetic shunt 510, permanent magnet 531, permanent magnet 532, pole 540, and pole 550. The distal end of pole 540 and the distal end of pole 550 are separated by gap 520.

In this illustrated embodiment, the magnetic field across gap 520 is created by magnet shunt 510, permanent magnet 531, permanent magnet 532, and pole pieces 540 and 550. In this embodiment, magnet poles 540, 550, and 560 are connected to the cathode.

The illustrated embodiment of FIG. 5 includes magnetic shunt 590 disposed within channel 503. Shunt 590 includes bottom 592 portion and a plurality of sides 593 attached to and extending outwardly from bottom portion 592 to define an enclosure having open end 594. Open end 594 of magnetic shunt 590 faces gap 520. Anode 502 is disposed within magnetic shunt 590. Anode 502 is positioned to cut electron trapping magnetic field lines.

In certain embodiments, magnetic shunt 590 has a cylindrical shape which includes open end 594. In certain embodiments, magnetic shunt 590 has a rectangular shape which includes open end 594. In certain embodiments, magnetic shunt 590 is formed from a high permeable material such as iron or steel. Magnetic shunt 595 is configured similarly to magnetic shunt 590.

The illustrated embodiment of FIG. 5, Applicant's source 500 produces a single, strong magnetic mirror field in gap 520 between poles 540 and 550. In this embodiment, the strong mirror field is created by the pointed shape of magnetic poles 540 and 550, and by magnetic shunts 580, 582, and 590. The pointed shape concentrates the magnetic field from magnets 531/532 to create a large magnetic mirror field across the gap 520. The shunts 580, 582, and 590, accentuate the mirror field while also pulling magnetic field away to eliminate low mirror field lines. The result is a single, strong magnetic mirror field across gap 520.

So too in gap 525 between poles 550 and 560. The strong mirror field is created by the pointed shape of magnetic poles 550 and 560, and by magnetic shunts 582, 584, and 595. The pointed shape concentrates the magnetic field from magnets 534 to create a large magnetic mirror field across the gap 525. The shunts 582, 584, and 595, accentuate the mirror field while also pulling magnetic field away to eliminate low mirror field lines. The result is a single, strong magnetic mirror field across gap 525.

The field strengths generated by ion source 500 comprising Ceramic 8 magnets, carbon steel poles, and a carbon steel shunt include a primary field line 570 having a magnetic field strength of 5141 Gauss at end 572 disposed on central pole 550 and 4848 Gauss on second end 576 disposed on outer pole 560. In the center of the gap 525 at position 574, the primary field line has a minimum magnetic field strength of 1487 Gauss. Therefore, the mirror field ratio for device 500 is in excess of 3:1. In addition, the ratio of magnetic strengths at the poles, i.e. at ends 572 and 574, is 1.06 showing a substantially symmetrical mirror field disposed within gap 525. An identical primary field line is produced across gap 520, where that primary field line has a mirror field ratio greater than 3 and an end-to-end ratio of about 1.06.

The materials and absolute magnitudes are not critical. Rather, the relative magnitudes from the pole surface to the gap center along the central field line is significant. Rare earth magnets can be used along with vanadium permador pole material to increase the absolute field strength magnitudes. The strong mirror field produces a focusing effect on electrons trapped in the field. Rather than ranging between the containing pole surfaces, these electrons are concentrated in the central gap region.

Applicant's device not only generates a strong mirror field, that design also reduces regions of weak mirror fields where ionization occurs. This effect results from several design features. First, magnetic shunts 590 and 595 pull magnetic field from pole regions of weaker magnetic field. In addition, the anodes 502/504 are positioned to remove electrons from weaker magnetic field regions. Both these design elements effectively prevent high energy electrons from being trapped in regions of weak magnetic mirror fields.

In certain embodiments, magnetic shunt 580 is disposed about 0.0625 inch from the top surface of pole 540. In certain embodiments, magnetic shunt 582 is disposed about 0.0625 inch from the top surface of pole 550. In certain embodiments, magnetic shunt 584 is disposed about 0.0625 inch from the top surface of pole 560.

Magnetic shunts 580 and 582 reduce the amount of weak mirror field regions near the electron-confined area. If the widths of gap 520 and/or 525 are increased, then more E field moves outside the gap, and eliminating weak mirror fields outside the source becomes even more important.

The magnet design and pole structure of Applicant's source 500 creates a substantially symmetrical magnetic mirror field between the two poles. As electrons gyrate along field lines, they are trapped into the center by both poles. In several prior art sources, a single magnet is used in the center region. As was shown in the analysis of these sources, this produces an unsymmetrical magnetic field in the gap. If a strong magnetic mirror on one pole is not matched along that field line by a similarly strong mirror field at the opposed pole, the mirror field is wasted. Electrons will be pushed away from the mirror pole and will escape to the wall of the poor mirror pole.

The symmetrical, strong mirror magnetic fields opposed to each other along the same primary field line generated using Applicant's device 500 is a significant advance over the prior art. Creating a single strong mirror field in the containment region and minimizing weak mirror fields has several benefits. The high energy electrons are confined radially by the mirror field. Instead of only the longitudinal vXB confinement, radial confinement limits electron "conductance" to further compact and condense the electrons into the center of the gap. This produces a higher electron "pressure" in the central region improving efficiency of the source.

More ionization occurs in the center of the gap away from the pole surfaces. In this central region, the electric field tends to push the ions out of the source rather than toward the cathode poles. This further improves efficiency and reduces pole erosion. In sources with insulating poles and weak mirror magnetic fields, a significant portion of electrons are lost to the walls without accomplishing ionization. With a strong mirror field, many electrons are reflected back as they approach the side wall. The stronger the mirror field, the larger the percentage of reflected electrons and the higher the source efficiency.

By minimizing regions of weak mirror field, pole erosion is reduced and source efficiency is increased. In regions of weak mirror field, electrons can more freely range between the containing surfaces. As ions are produced from electron collisions wherever high energy electrons are, ions are created more evenly throughout the physical containment region. When ions are created close to a side wall, they are more likely to "see" the side wall and be accelerated to it. Ion bombardment of the side walls causes side wall erosion and reduces source efficiency.

A strong mirror field in the gap also reduces source heating. Source heating is caused by both high energy electron wall losses and ion wall bombardment. The preferred embodiment reduces both of these. By focusing electrons in the center of the gap and concentrating ionization there, more ions are ejected perpendicular to the racetrack closed loop. This results in a more efficient ion thruster or industrial ion source.

The illustrated embodiment of FIG. 5 is also effective when operated in the plasma or diffuse mode. In the standard "ion beam" or collimated mode, the electric fields are not altered by a conductive plasma in the gap. This mode is maintained by operating at low pressures (~less than 1 mTorr) or at lower powers. In the diffuse mode, sufficient plasma develops in the gap to produce a conductive plasma region and change the electric fields. This mode is often avoided because the earlier stated problems of source heating and side wall erosion are exacerbated.

Focusing the plasma into the center of a single, strong mirror field helps to reduce pole erosion and increase efficiency in the diffuse mode. As in the collimated mode, the mirror field tends to confine electrons into the center of the gap. This confines the plasma toward the center producing the benefits as stated above.

Ions can also be affected by the preferred embodiment. When magnetic field strengths approach or exceed 1000 Gauss, ions in the gap can become magnetized. That is, the radius of gyration of the ions is less than the size of the magnetic field. When magnetized, ions are also affected by a strong magnetic mirror field in the gap and, like electrons, are focused into the center of the gap.

The poles of source 500 are shaped to focus the magnetic field to create a strong mirror. By shaping the high permeability poles, the magnetic field emanating from the pole can be made significantly stronger. As shown in FIG. 5, as the poles neck down toward the gap the magnetic field tends to try to stay in the pole material. This progressively compresses the field and results in a strong mirror field at the end of the pole.

In certain embodiments, the poles are formed of steel. Steel is used because it has a relatively high permeability and high saturation level. In addition, steel is inexpensive and easy to machine. In other embodiments, the poles are formed using other materials that are more permeable and saturate at higher levels than steels. Other magnet materials such as rare earth magnets, soft ferrite magnets or electromagnets can also be implemented. The material selection and choice of magnets will vary with the application.

For use in industrial applications where high powers and continuous usage is the norm, Applicant's ion source optionally includes a cooling apparatus. In certain embodiments, Applicant's device utilizes water cooling. In one embodiment, the poles are drilled such that water can flow through them. In these embodiments, a magnetic stainless steel such as grade 416 is used. This material does not corrode easily, is machinable, and has acceptable magnetic properties.

Figure 6:
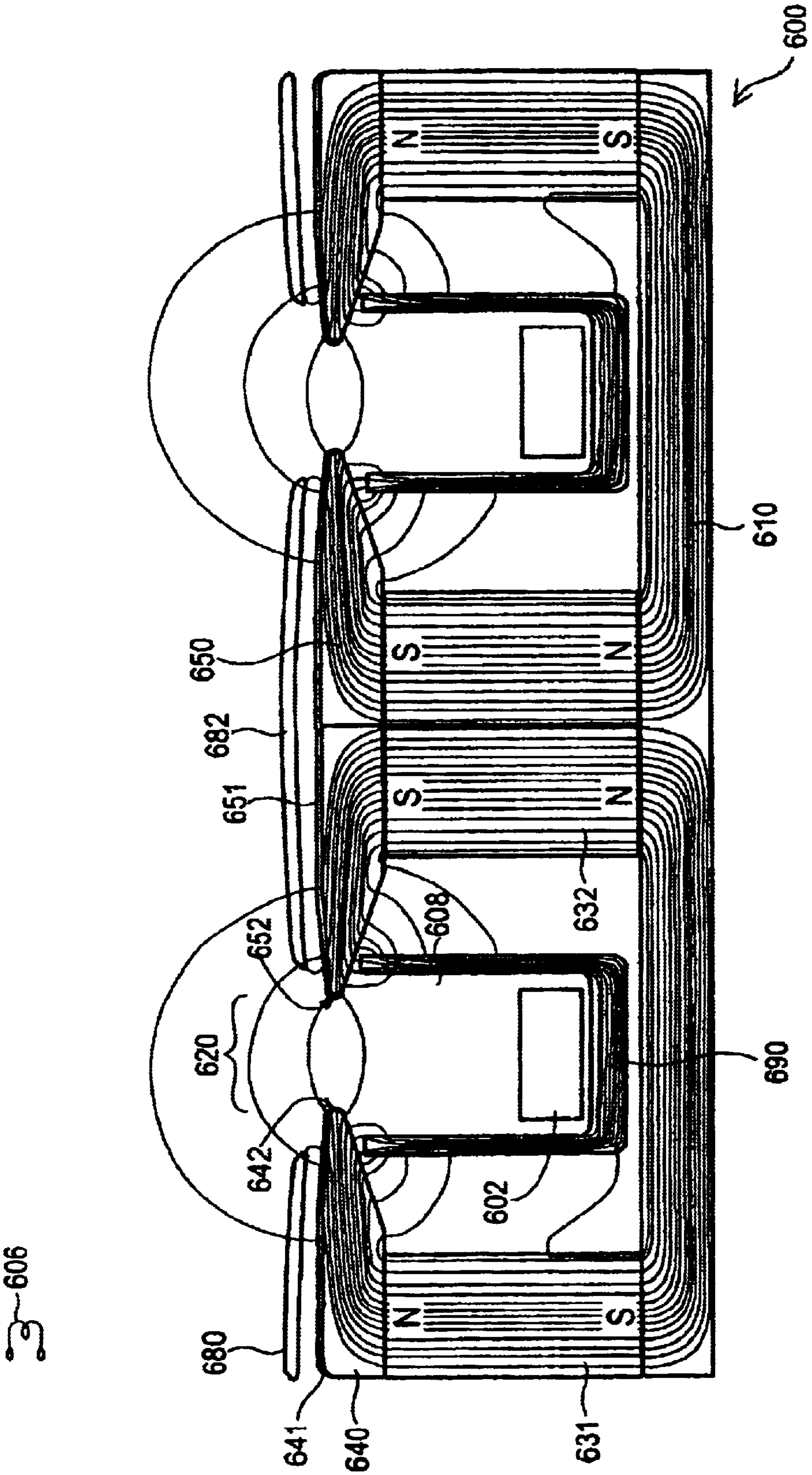
FIG. 6 shows a section view of an extended acceleration channel ion source of one embodiment of Applicant's ion source.

Referring to FIG. 6, in certain embodiments region 642 on pole 640 and region 652 on pole 650 have a rounded shape. In certain embodiments, regions 642 and 652 have a pointed shape. In the illustrated embodiment of FIG. 6, a 0.03 inch radius is given to regions 642 and 652. The configurations shown in FIG. 6 and described herein for regions 642/652 of poles 640/650, respectively, can be used with poles 540, 550, and 560, in device 500.

While sharper points can provide higher surface magnetic fields and a larger central field mirror effect, the mirror effect is concentrated in a smaller region, enlarging the weaker mirror regions. Using a radius for regions 642/652 as shown in FIG. 6 produces a larger strong mirror field region. Also, magnetic saturation tends to lower the local sharp point effect. In certain embodiments, the poles can take on a variety of shapes. For instance, the poles can be made from thin sheet metal or a combination of several metal sheets or plates.

FIG. 6 shows a section view of Applicant's ion source 600 comprising an extended acceleration channel. Again, a strong magnetic mirror field is produced in gap region 620 by magnetic shunt 610, magnet 531 and poles 640 and 650. Magnetic shunt 690 is extended downward to allow anode 602 to be disposed further from the magnetic field. In certain embodiments of ion source 600 the magnetic poles are not connected to the source power supply. In certain embodiments, the magnetic poles are energized by a second bias supply.

In certain embodiments, electrons are supplied by source 606. External magnetic shunts 680 and 682 reduce the external magnetic fields and concentrate the mirror field in gap 620. In this source 600, electrons leaving the emission source are trapped in gap 620 by the magnetic field. By eliminating regions of weaker mirror fields, the circuit resistance is concentrated in the strong mirror region, and the voltage drop between the cathode 606 and anode 602 takes place wholly in this region. Again, high energy electrons are "focused" both longitudinally and radially into the center of gap 620, and a greater majority of the ions are produced in the center. All the benefits stated above are achieved with this source.

In certain embodiments, magnetic pole 640 includes a close fitting pole cover 641. In certain embodiments, cover 641 is disposed around the portion of pole 640 disposed adjacent gap 620. In certain embodiments, this close fitting cover comprises a low sputter rate material.

In certain embodiments, the top surface of magnetic pole 640 includes coating 641. In certain embodiments, coating 641 comprises one or more materials having high secondary electron emission properties. The secondary electron emission process from solids is, in some cases, a very efficient mechanism of producing detectable electronic charges. In these embodiments, coating 641 serves as an additional source of electrons. In certain embodiments, coating 641 has a secondary electron emission coefficient δ of about 1 or more. In certain embodiments, coating 641 is selected from the group consisting of Magnesium oxide, low-density and columnar-grown CsI crystals, CVD diamond films, and mixtures thereof.

In certain embodiments, magnetic pole 650 includes a close fitting pole cover 651. In certain embodiments, cover 651 is disposed around the portion of pole 650 disposed adjacent gap 620. In certain embodiments, close fitting cover 651 comprises a low sputter rate material.

In certain embodiments, the top surface of magnetic pole 650 includes coating 651. In certain embodiments, coating 651 comprises a material having high secondary electron emission properties. In certain embodiments, coating 651 has a secondary electron emission coefficient δ of about 1 or more. Such a material serves as an additional source of electrons. In certain embodiments, coating 651 is selected from the group consisting of Magnesium oxide, low-density and columnar-grown CsI crystals, CVD diamond films, and mixtures thereof.

Figure 7:
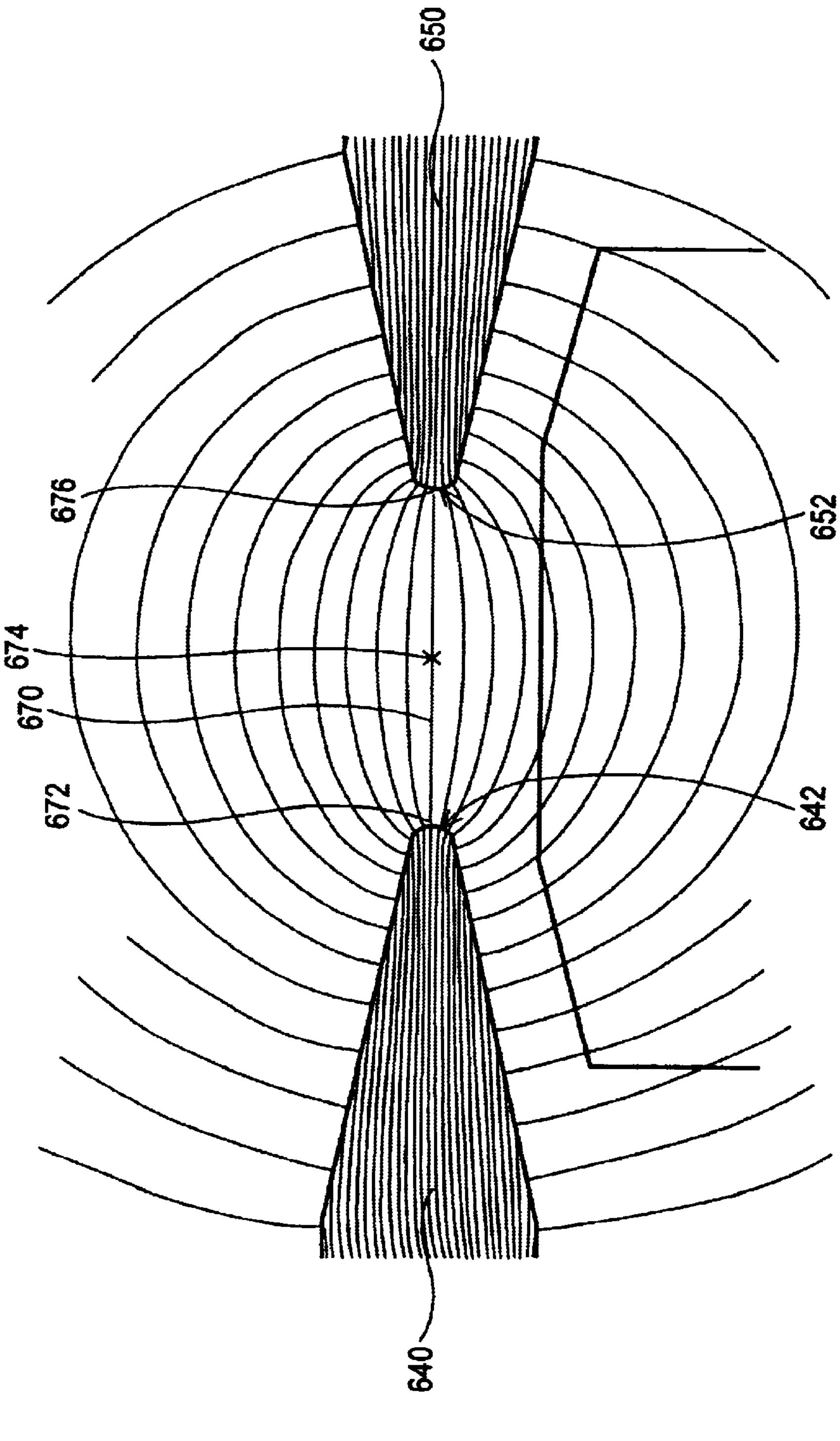
FIG. 7 shows one embodiment of the poles of one embodiments of Applicant's anode layer type source and the magnetic field strengths at different places in the gap.

FIG. 7 shows a detail of the magnetic fields existing in gap 620 disposed between poles 640 and 650 in device 600. Field line 670 comprises the primary field strength line. Primary field line 670 has a magnetic field strength at a first end 672 disposed on surface 642 of pole 640 of 5142 Gauss. Primary field line 670 has a magnetic field strength at a second end 676 disposed on surface 652 of pole 650 of 4848 Gauss. Primary field line 670 has a minimum magnetic field strength of 1488 Gauss at location 674 disposed about equidistant between surface 642 and surface 652. Device 600 has a mirror field of about 3.46. In addition, device 600 has an end-to-end ratio of 1.06 showing a substantially symmetrical mirror field existing between poles 640 and 650.

As FIG. 7 shows, the magnetic field is concentrated effectively at the pointed pole region and results in producing a mirror field in the gap in excess of 2:1. Further away from the pole point, the magnetic field strength diminishes quickly, and the mirror field becomes weaker. Rather than eliminating the weaker field regions with a magnetic shunt as in the previous figures, in device 600 the anode is placed to cut these weaker mirror field lines. In this position, the anode serves to collect electrons and eliminate ionization in the region of weak mirror field.

In certain embodiments, Applicant's ion source does not include external magnetic field shunts 580/582/584 or 680/682/684. In these embodiments, the magnetic poles are connected to the cathode electrode. In these embodiments, the electric field is largely contained within the body of the source. Therefore, the weak external magnetic mirror fields have a minimal effect on source efficiency, and the complexity of additional parts is avoided.

Figure 8:
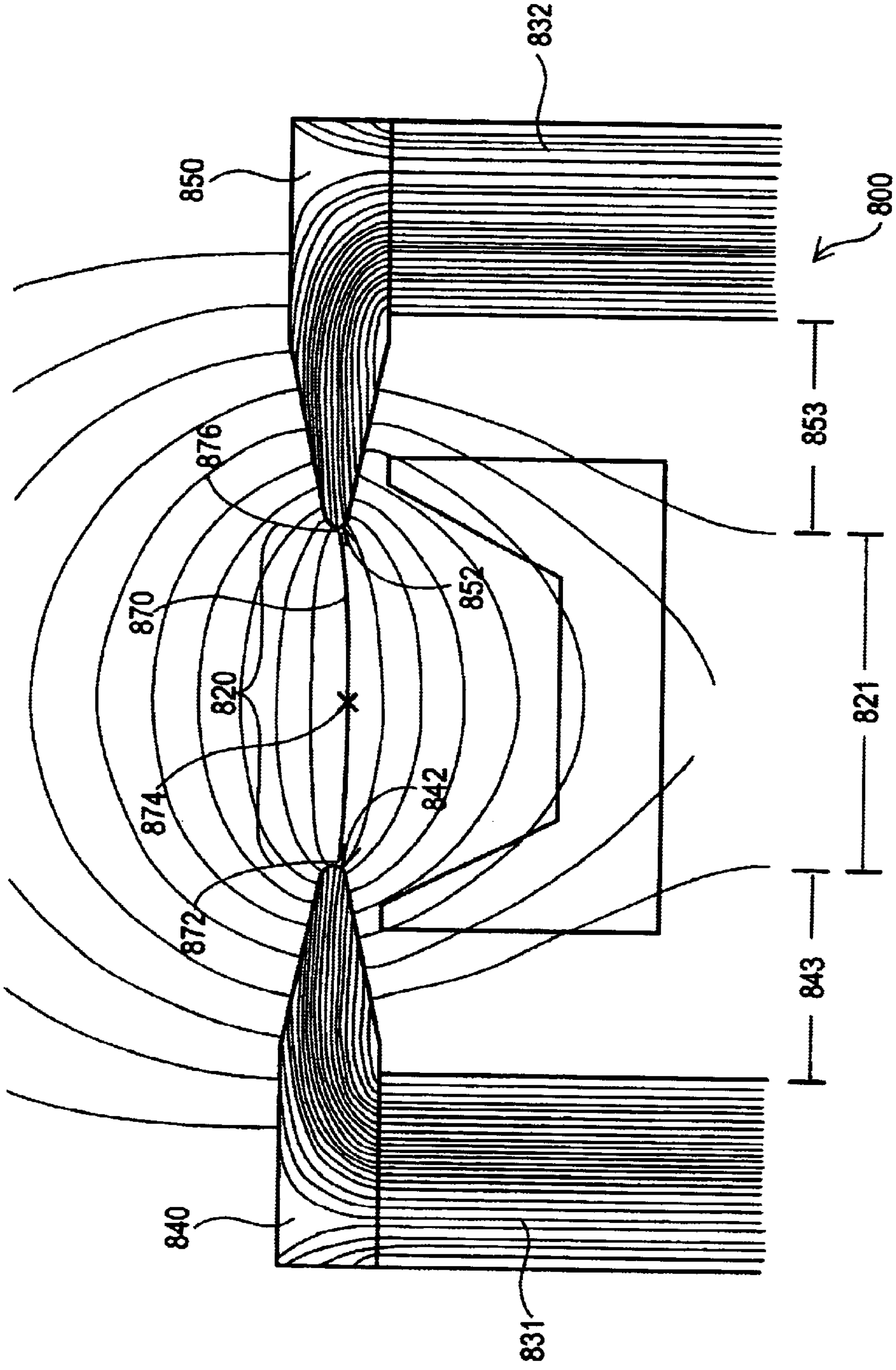
FIG. 8 shows a one side of one embodiment of Applicant's closed loop ion source.

FIG. 8 shows a detail view of one side of Applicant's closed loop ion source 800 having a wider gap between the magnetic poles. Other than the distance of gap 820, source 800 comprises either the configuration of device 500 or 600. In this embodiment, pole 840 extends a distance 843 inward from the inner surface of magnet 831. Pole 850 extends a distance 853 inward from the inner surface of magnet 832. Pole surfaces 842 and 852 are separated by a distance 821.

Analysis of the field strengths existing in device 800 shows that by widening the gap, the magnetic mirror field ratio between the central field strength and the field strength at the adjacent to the pole surface is increased. Primary field line 870 has a strength of 3535 Gauss at first end 872 disposed on surface 842, a strength of 3535 Gauss at second end 876 disposed on surface 852, and a minimum field strength of 6849 Gauss at location 874. Location 874 is substantially equidistant between surface 842 and surface 852. The mirror field ratio of primary field line 870 is greater than 5:1. Primary field strength line 870 has an end-to-end ratio of 1 showing a symmetrical mirror field.

Formula (1) expresses the fraction, in percent, of trapped electrons to the mirror field ratio.

$$\text{Fraction } (\%)=(1-(B_{min}/B_{max}))^{1/2} \quad (1)$$

Using device 800 with a mirror ratio of 5:1, the fraction of trapped electrons is about 89%.

Figure 9:
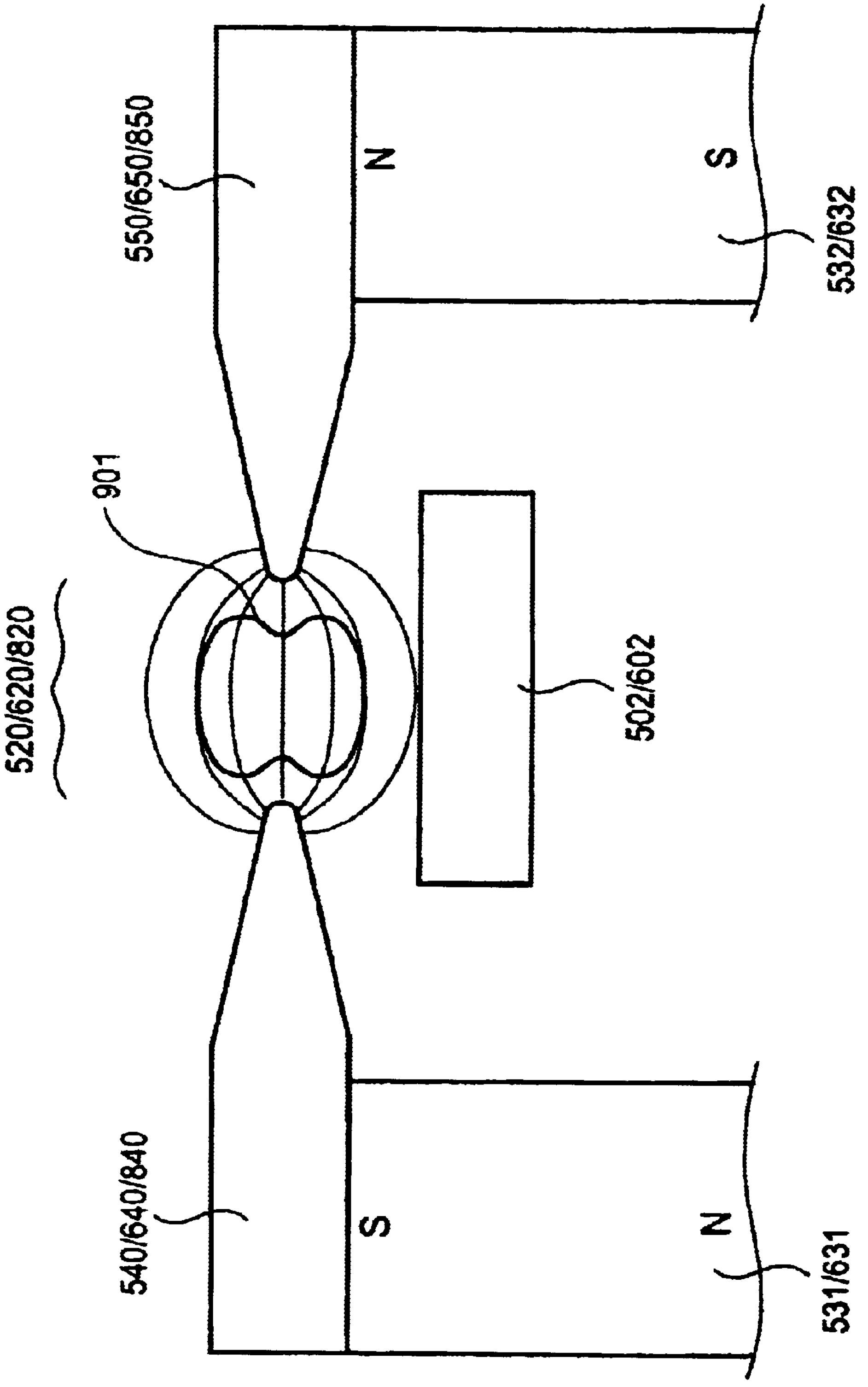
FIG. 9 shows plasma containment using Applicant's ion source.

FIG. 9 shows plasma containment using Applicant's source 500, 600, 800. A conductive plasma 901 is shown in gap 520/620/820 of devices 500, 600, 800, respectively. Even though plasma 901 is conductive, all regions of that plasma are not equally conductive. This results from changing magnetic fields within the plasma. Axially, the plasma "current" impedance is greater in the central region where the magnetic field is greatest. The larger impedance is due to the smaller gyro-radius in this region and the reduced electron mobility. Radially, with a strong magnetic mirror radial field produced by Applicant's ion source, the impedance of the plasma is greater closer to the poles. Changes in impedance, like current in a wire, results in associated voltage drops and therefore, while the plasma may be considered conductive, the voltage within the plasma varies.

For instance, at the poles, since the impedance due to the higher magnetic field is higher for electrons, fewer electrons will "flow" toward the poles. This leads to electron depletion near the pole and a more positive voltage near the pole within the plasma. The more positive voltage reaches a steady state where enough electrons are attracted to the region to balance the ions present. The result is beneficial to ion source efficiency. The more positive voltage near the poles causes ions to be repelled back toward the center of the plasma. Axially, the same effect is at work and produces a higher voltage in the center with the peak voltage at the magnetic field primary line. Here, the higher voltage pushes ions out of the central region. The combined effect is to produce a gradient field toward regions of lower magnetic field strength. With a strong magnetic mirror field present in the gap, this produces a beneficial focusing effect out of the source.

Applicant's ion sources 500, 600, and 800, reduce the rate of erosion of the acceleration channel and/or pole surface material. As a result, several benefits are realized. For example, the life of the source is extended, less heat is generated in the source, the source is made more efficient, and less sputtered, contaminating material is ejected from the source. In addition, Applicant's ion sources 500, 600, and 800, collimate the ion beam exiting the source to produce a more focused, useful energy beam.

Applicant's ion sources 500, 600, and 800, reduce the wall losses of energetic electrons, particularly those capable of ionizing the source fuel. This further increases the efficiency of the source and reduces source heating. In addition, Applicant's ion sources 500, 600, and 800, improve the operation of long acceleration channel ion sources and space based ion thrusters.

Applicant's ion sources 500, 600, and 800, further improve the operation of short acceleration channel sources termed anode layer sources, and improve the operation of anode layer type sources operated as plasma sources in the diffuse high current, low voltage mode.

While the preferred embodiments of the present invention have been illustrated in detail, it should be apparent that modifications and adaptations to those embodiments may occur to one skilled in the art without departing from the scope of the present invention as set forth in the following claims.

I claim:

1. A closed drift ion source, comprising:

a channel having an open end and a closed end, wherein said channel includes an input port for an ionizable gas;

a first magnetic pole disposed on said open end of said channel and extending therefrom in a first direction;

a second magnetic pole disposed on said open end of said channel and extending therefrom in a second direction, wherein said first direction is opposite to said second direction;

an anode disposed within said channel;

a primary magnetic field line disposed between said first magnetic pole and said second magnetic pole, wherein said primary magnetic field line has a mirror field greater than 2.

2. The closed drift ion source of claim 1, wherein said first and second magnetic poles comprise cathode electrodes.

3. The closed drift ion source of claim 1, wherein said first and second magnetic poles are electrically isolated.

4. The closed drift ion source of claim 1, wherein said mirror field is substantially symmetric.

5. The closed drift ion source of claim 4, wherein said first magnetic pole comprises a first distal end, and wherein said second magnetic pole comprises a second distal end, and wherein said first distal end is separated from said second distal end by a gap, wherein said primary magnetic field line comprises a minimum magnetic field strength value disposed about equidistant from said first distal end and said second distal end.

6. The closed drift ion source of claim 5, wherein said anode is disposed on a first side of said gap, further comprising a cathode disposed on a second side of said gap.

7. The closed drift ion source of claim 6, wherein said first magnetic pole comprises a top surface, and wherein said second magnetic pole comprises a top surface, further comprising:

a first coating disposed on said top surface of said first magnetic pole, wherein said first coating comprises a material having a secondary electron emission coefficient of about 1 or more; and a second coating disposed on said top surface of said second magnetic pole, wherein said second coating comprises a material having a secondary electron emission coefficient of about 1 or more.

8. The closed drift ion source of claim 1, further comprising a first magnetic shunt disposed within said channel between said open end and said closed end, wherein said first magnetic shunt includes a bottom portion and a plurality of sides attached to and extending outwardly from said bottom portion to define an enclosure having an opening, wherein said opening of said first magnetic shunt faces said open end of said channel, wherein said anode is disposed within said first magnetic shunt.

9. The closed drift ion source of claim 8, further comprising:

a first permanent magnet attached to said first magnetic pole;

a second permanent magnet attached to said second magnetic pole; and a second magnetic shunt attached to said first permanent magnet and to said second permanent magnet;

wherein said anode is disposed between said first permanent magnet and said second permanent magnet.

10. The closed drift ion source of claim 9, further comprising:

a third magnetic shunt disposed between said first magnetic pole and a cathode; and a fourth magnetic shunt disposed between said second magnetic pole and a second cathode.

11. A closed drift ion source, comprising:

a first permanent magnet, where said first permanent magnet comprises a first pole having a first magnetic polarity and a second pole having a second magnetic polarity;

a second permanent magnet, wherein said second permanent magnet comprises a first pole having said first magnetic polarity and a second pole having said second magnetic polarity;

a first magnetic pole and a second magnetic pole;

wherein said first magnetic pole has a top surface, a bottom surface, a first end and a second end, wherein said bottom surface of said first magnetic pole at said first end is disposed adjacent said second end of said first permanent magnet and wherein said second end of said first magnetic pole extends from said first permanent magnet in a first direction toward said second magnetic pole;

wherein said second magnetic pole has a top surface, a bottom surface, a first end and a second end, wherein said bottom surface of said second magnetic pole at said first end is disposed adjacent to said first end of said second permanent magnet and wherein said second end of said second magnetic pole extends from said second permanent magnet in a second direction toward said first magnetic pole;

wherein said first direction is opposite to said second direction, and wherein said second end of said first magnetic pole is separated from said second end of said second magnetic pole by a gap;

a first magnetic shunt comprising a bottom portion and a plurality of sides attached to and extending outwardly from said bottom portion to define an enclosure having an opening, wherein said first magnetic shunt is disposed between said first permanent magnet and said second permanent magnet such that said opening of said first magnetic shunt faces said gap;

an anode disposed within said first magnetic shunt;

a second magnetic shunt having a first end and a second end, wherein said first end of said second magnetic shunt is attached to said first end of said first permanent magnet, and wherein said second end of said second magnetic shunt is connected to said second end of said second permanent magnet;

a primary magnetic field line disposed between said first magnetic pole extension and said second magnetic pole extension, wherein said primary magnetic field line has a mirror field greater than 2.

12. The closed drift ion source of claim 11, wherein said anode is disposed on a first side of said gap, further comprising a cathode disposed on a second side of said gap.

13. The closed drift ion source of claim 12, further comprising:

a third magnetic shunt disposed between said first magnetic pole and said cathode; and a fourth magnetic shunt disposed between said second magnetic pole and said cathode.

14. The closed drift ion source of claim 13, wherein said mirror field is substantially symmetric.

15. The closed drift ion source of claim 14, wherein said first magnetic pole comprises a first distal end, and wherein said second magnetic pole comprises a second distal end, wherein said primary magnetic field line comprises a minimum magnetic field strength value disposed about equidistant from said first distal end and said second distal end.

16. A method to focus a plasma, comprising the steps of:

providing an ionizable gas;

introducing said ionizable gas into a closed drift ion source comprising a first magnetic pole and a second magnetic pole separated by a gap;

producing a primary magnetic field line disposed between said first magnetic pole and said second magnetic pole, wherein said primary magnetic field line has a mirror field greater than 2; and forming in said gap a plasma from said ionizable gas.

17. The method of claim 16, further comprising the step of producing a symmetric primary magnetic field line.

18. The method of claim 16, wherein said first magnetic pole comprises a first distal end, and wherein said second magnetic pole comprises a second distal end, and wherein said first distal end is separated from said second distal end by said gap, wherein said primary magnetic field line comprises a minimum magnetic field strength value disposed about equidistant from said first distal end and said second distal end.

19. The method of claim 16, wherein said closed drift ion source comprises:

a channel having an open end and a closed end, wherein said channel includes an input port for said ionizable gas, and wherein said first magnetic pole is disposed on said open end of said channel and extends therefrom in a first direction, and wherein said second magnetic pole is disposed on said open end of said channel and extends therefrom in a second direction, wherein said first direction is opposite to said second direction;

a first magnetic shunt disposed within said channel between said open end and said closed end, wherein said first magnetic shunt includes a bottom portion and a plurality of sides attached to and extending outwardly from said bottom portion to define an enclosure having an opening, wherein said opening of said first magnetic shunt faces said open end of said channel; and an anode disposed within said first magnetic shunt.

20. The method of claim 19, wherein said first and second magnetic poles comprise cathode electrodes.

21. The method of claim 19, wherein said first and second magnetic poles are electrically isolated.

22. The method of claim 21, wherein said closed drift ion source further comprises:

a first permanent magnet attached to said first magnetic pole;

a second permanent magnet attached to said second magnetic pole;

a second magnetic shunt attached to said first permanent magnet and to said second permanent magnet;

a cathode disposed adjacent a first side of said gap, wherein said anode is disposed adjacent a second side of said gap;

a third magnetic shunt disposed between said first magnetic pole and said cathode; and a fourth magnetic shunt disposed between said second magnetic pole and said cathode.

* * * * *